(12) United States Patent
Philipp et al.

(10) Patent No.: US 7,539,050 B2
(45) Date of Patent: May 26, 2009

(54) RESISTIVE MEMORY INCLUDING REFRESH OPERATION

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/603,636

(22) Filed: Nov. 22, 2006

(65) Prior Publication Data

US 2008/0117663 A1    May 22, 2008

(51) Int. Cl.
    *G11C 11/00*    (2006.01)
(52) U.S. Cl. .................................. 365/163; 365/233.11
(58) Field of Classification Search ................. 365/163, 365/233
    See application file for complete search history.

(56) References Cited

U.S. PATENT DOCUMENTS

| | | | |
|---|---|---|---|
| 4,694,391 A | | 9/1987 | Guttag et al. |
| 4,896,146 A | * | 1/1990 | Narumiya .................... 345/550 |
| 5,517,462 A | * | 5/1996 | Iwamoto et al. ............. 365/233 |
| 5,583,818 A | * | 12/1996 | You et al. .................... 365/222 |
| 5,623,221 A | * | 4/1997 | Miyake ....................... 327/108 |
| 5,629,895 A | * | 5/1997 | Dosaka et al. ......... 365/189.011 |
| 5,629,898 A | * | 5/1997 | Idei et al. .................... 365/222 |
| 5,784,328 A | | 7/1998 | Irrinki et al. |
| 6,065,132 A | * | 5/2000 | Takano ........................ 713/600 |
| 6,105,145 A | * | 8/2000 | Morgan et al. .............. 713/501 |
| 6,269,041 B1 | * | 7/2001 | Wang et al. .................. 365/222 |
| 6,768,665 B2 | | 7/2004 | Parkinson et al. |
| 6,898,140 B2 | | 5/2005 | Leung et al. |
| 7,093,047 B2 | * | 8/2006 | Au et al. ...................... 710/243 |
| 2001/0040833 A1 | | 11/2001 | Bogin et al. |
| 2003/0081484 A1 | * | 5/2003 | Kobayashi et al. .......... 365/222 |
| 2004/0022085 A1 | | 2/2004 | Parkinson et al. |
| 2004/0044841 A1 | | 3/2004 | Gilton |
| 2005/0146964 A1 | * | 7/2005 | Sako ........................... 365/211 |
| 2005/0190622 A1 | * | 9/2005 | Choi ........................... 365/212 |
| 2005/0271115 A1 | * | 12/2005 | Takeuchi ....................... 374/1 |
| 2005/0276139 A1 | * | 12/2005 | Choi et al. ................... 365/211 |
| 2005/0280479 A1 | * | 12/2005 | Lin ............................. 331/185 |
| 2006/0056251 A1 | | 3/2006 | Parkinson |
| 2006/0077742 A1 | * | 4/2006 | Shim et al. .................. 365/222 |
| 2006/0158948 A1 | | 7/2006 | Fuji |

FOREIGN PATENT DOCUMENTS

EP    1 420 412    5/2004

(Continued)

OTHER PUBLICATIONS

A. Ltri, et al., "Analysis of Phase-Transformation Dynamics and Estimation of Amorphous-Chalcogenide Fraction in Phase-Change Memories", IRPS, 2004.

(Continued)

*Primary Examiner*—Michael T Tran
(74) *Attorney, Agent, or Firm*—Dicke, Billig & Czaja, PLLC

(57) ABSTRACT

A memory device includes an array of resistive memory cells, a counter having an increment step based on temperature, and a circuit for refreshing the memory cells in response to the counter exceeding a preset value.

30 Claims, 8 Drawing Sheets

FOREIGN PATENT DOCUMENTS

| | | |
|---|---|---|
| EP | 1420412 A1 | 5/2004 |
| EP | 1717817 A1 | 11/2006 |
| EP | 1858021 A2 | 11/2007 |
| EP | 1883074 A1 | 1/2008 |

OTHER PUBLICATIONS

A. Redaelli, et al., "Impact of Crystallization Statistics on Data Retention for Phase Change Memories", submitted to IEDM, 2005.

S. L. Cho et al., "Highly Scalable On-Axis Confined Cell Structure for High Density PRAM Beyond 256Mb", VLSI, 2005.

S. Lai, T. Lowrey, "OUM-a 180 NM NonVolatile Memory Cell Element Technology for Stand Alone and Embedded Applications", IEDM 2001.

S. Lai, "Current Status of the Phase Change Memory and its Future" IEDM 2003.

H. Horii, J. H. Yi, J. H. Park, Y. H. Ha, I. G. Baek, S. O. Park, Y. N. Hwang, S. H. Lee, Y. T. Kim, K. H. Lee, U. I. Chung, J. T. Moon, "A Novel Cell Technology Using N-Doped GeSbTe Films for Pahse Change RAM", VLSI, 2003.

* cited by examiner

US 7,539,050 B2

RESISTIVE MEMORY INCLUDING REFRESH OPERATION

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy. For simplicity, the description in this disclosure is substantially focused on four different resistance levels or states and two bits of data per cell. This is for illustrative purposes only, however, and not intended to limit the scope of the invention. In principle it is possible to store three or more states.

The data retention performance of a phase change memory depends strongly upon the temperature history of the memory. Typically, for nonvolatile memory, data retention is guaranteed for more than ten years at operating temperatures up to 85° C. Data retention is mainly a material property and depends on the crystallization temperature of the phase change material. For example, for $Ge_2Sb_2Te_5$, the data retention performance is about ten years at operating temperatures up to 105° C. to 110° C. For many applications, however, this temperature specification is not sufficient. For example, in automotive applications this temperature specification may be exceeded. Also, a memory device is not usually operated at a constant ambient temperature, but rather experiences significant changes in the ambient temperature. For example, a memory device for an engine controller of a vehicle experiences extremes in temperatures based on whether the engine is running. In this case, data retention of the memory device is not so strongly impacted by momentary temperatures (within certain limits) or an average temperature, but rather by the temperature budget accumulated by the memory device. In addition, data retention is more critical in multi-bit phase change memory cells than in single bit phase change memory cells.

In addition, when reading a resistance value of a phase change memory cell using a typical read operation, there is a risk of read disturb, which causes additional crystallization of the phase change material. The additional crystallization of the phase change material may modify the resistance value of the memory cell and corrupt the data stored therein.

For these and other reasons, there is a need for the present invention.

SUMMARY

One embodiment provides a memory device. The memory device includes an array of resistive memory cells, a counter having an increment step based on temperature, and a circuit for refreshing the memory cells in response to the counter exceeding a preset value.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
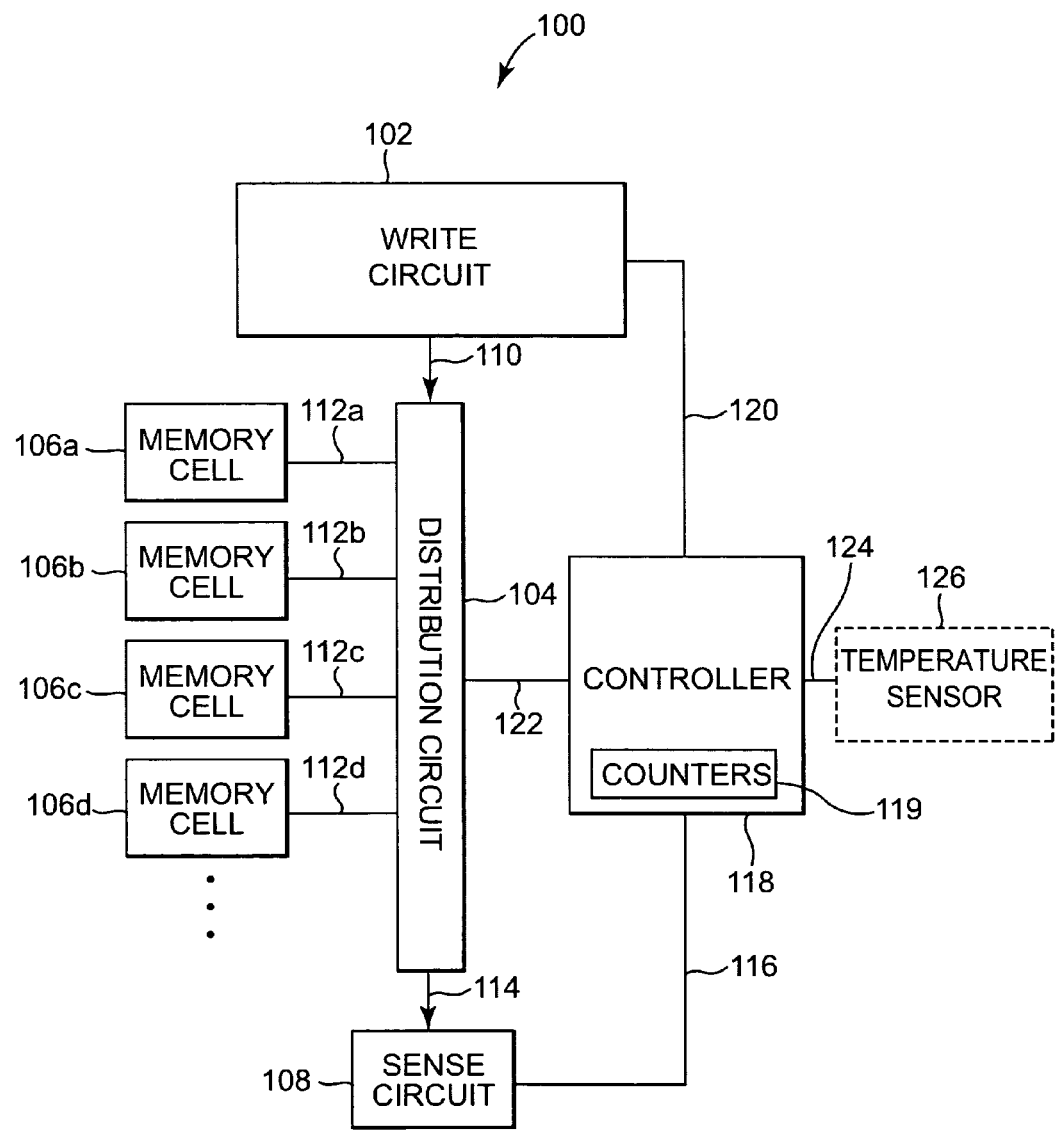
FIG. 1 is a block diagram illustrating one embodiment of a memory device.

FIG. 1 is a block diagram illustrating one embodiment of a memory device 100. Memory device 100 includes a write circuit 102, a distribution circuit 104, memory cells 106a, 106b, 106c, and 106d, a controller 118, an optional temperature sensor 126, and a sense circuit 108. Controller 118 includes counters 119, such as clock cycle counters, read access counters, or other suitable counters. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material, and hence the cell resistance, is controlled using a suitable write strategy.

Memory cells 106a-106d are periodically refreshed to maintain their values. In one embodiment, memory cells 106a-106d are refreshed each time a preset number of clock cycles have been counted by a cycle counter. In one embodiment, the increment step of the cycle counter is based on the temperature of memory device 100. In one embodiment, for temperatures below 60° C. the increment step is one, for temperatures between 60° C. and 90° C. the increment step is two, and for temperature above 90° C. the increment step is three. In this way, memory cells 106a-106d are refreshed more often as the temperature of memory device 100 increases.

In another embodiment, memory cells 106a-106d are refreshed each time a preset number of read accesses have been counted by a read counter. In one embodiment, the increment step of the read counter is based on the temperature of memory device 100 as discussed above with reference to the cycle counter. In another embodiment, memory cells 106a-106d are refreshed each time a preset number of clock cycles have been counted by a cycle counter or each time a preset number of read accesses have been counted by a read counter. In one embodiment, the increment step of the cycle counter and the increment step of the read counter are based on the temperature of memory device 100. In another embodiment, memory cells 106a-106d are refreshed each time a preset number of counts have been counted by a counter. The counter increments in response to each clock cycle and in response to each read access. In one embodiment, the increment step of the counter for clock cycles and the increment step of the counter for read accesses are based on the temperature of memory device 100.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120, to distribution circuit 104 through signal path 122, and to optional temperature sensor 126 through signal path 124.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11,". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In addition, controller 118 controls a refresh interval for memory cells 106a-106d. Optionally, controller 118 receives the temperature of memory device 100 from temperature sensor 126. In one embodiment, controller 118 controls the refresh interval of memory cells 106a-106d based on the temperature of memory device 100 received from temperature sensor 126. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates a current or voltage pulse for heating the phase change material in the target memory cell. In one embodiment, write circuit 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase change material of the target memory cell above its crystallization temperature (but below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figure 2:
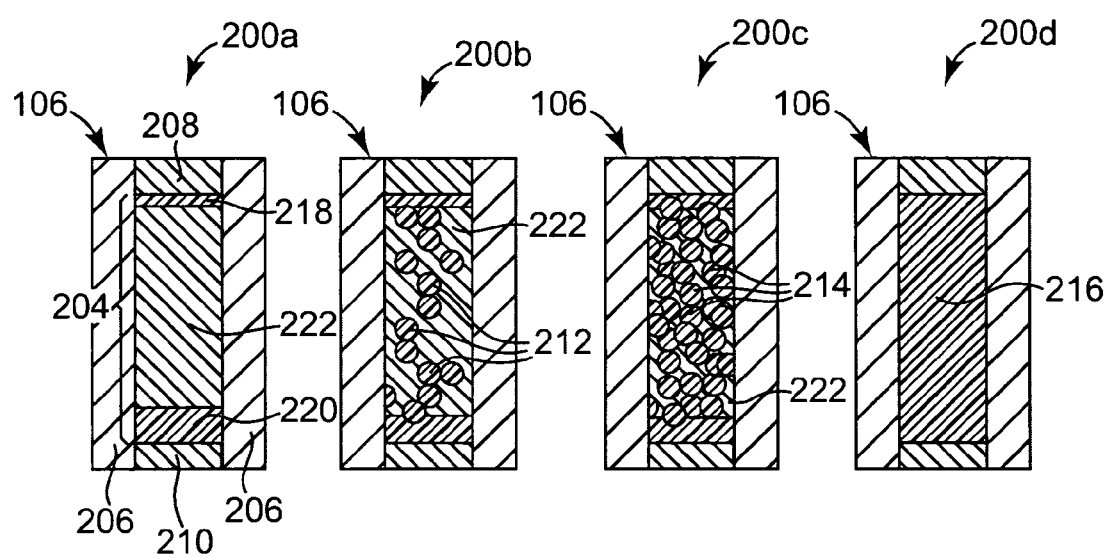
FIG. 2 is a diagram illustrating one embodiment of a multi-bit or multilevel phase change memory cell in four different states.

FIG. 2 is a diagram illustrating one embodiment of a multi-bit or multilevel phase change memory cell 106 in four different states at 200a, 200b, 200c, and 200d. Phase change memory cell 106 includes a phase change material 204 that is laterally surrounded by insulation material 206. Phase change memory cell 106 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change memory cell 106 via first electrode 208 and second electrode 210. The current path through phase change material 204 is from one of the first electrode 208 and second electrode 210 to the other one of the first electrode 208 and second electrode 210. Phase change memory cell 106 provides a storage location for storing bits of data.

Insulation material 206 can be any suitable insulator, such as $SiO_2$, SiOx, SiN, fluorinated silica glass (FSG), or borophosphorous silicate glass (BPSG). First electrode 208 and second electrode 210 can be any suitable electrode material, such as TiN, TiSiN, TiAlN, TaN, TaSiN, TaAlN, W, WN, Al, or Cu.

Each phase change memory cell 106 comprises a phase change material 204 that may be made up of a variety of materials in accordance with the present invention. Generally, chalcogenide alloys that contain one or more elements from group VI of the periodic table are useful as such materials. In one embodiment, phase change material 204 of phase change memory cell 106 is made up of a chalcogenide compound material, such as GeSbTe, SbTe, GeTe or AgInSbTe. In another embodiment, phase change material 204 is chalcogen free, such as GeSb, GaSb, InSb, or GeGaInSb. In other embodiments, phase change material 204 is made up of any suitable material including one or more of the elements Ge, Sb, Te, Ga, As, In, Se, and S.

Phase change material 204 is programmed into one of four resistance states to store two bits of data. A write circuit, such as write circuit 102, is electrically coupled to first electrode 208 to provide pulses to phase change material 204. The pulses reset phase change material 204 or program one of the other three resistance states into phase change material 204. At 200b, a small fraction 212 of phase change material 204 has been programmed through phase change into the crystalline state to change the resistance through phase change memory cell 106. At 200c, a medium sized fraction 214 of phase change material 204 has been programmed through phase change into the crystalline state to change the resistance through phase change memory cell 106. At 200d, a large fraction 216, which is substantially all of phase change material 204, has been programmed through phase change into the crystalline state to change the resistance through phase change memory cell 106.

The size of the programmed fraction is related to the resistance through phase change material 204 and phase change memory cell 106. The three different phase change fractions at 200b-200d plus the initial state at 200a provide four resistance states in phase change material 204, and phase change memory cell 106 provides a storage location for storing two bits of data. In one embodiment, the state of phase change memory cell 106 at 200a is a "00", the state of phase change memory cell 106 at 200b is a "01", the state of phase change memory cell 106 at 200c is a "10", and the state of phase change memory cell 106 at 200d is a "11". In another embodiment, the state of phase change memory cell 106 at 200a is a "11", the state of phase change memory cell 106 at 200b is a "10", the state of phase change memory cell 106 at 200c is a "01", and the state of phase change memory cell 106 at 200d is a "00".

At 200a, phase change material 204 is reset to a substantially amorphous state. During a reset operation of phase change memory cell 106, a reset current pulse is provided via write circuit 102 through first electrode 208 and phase change material 204. The reset current pulse heats phase change material 204 above its melting temperature and phase change material 204 is quickly cooled to achieve the substantially amorphous state at 200a. After a reset operation, phase change material 204 includes crystalline state phase change material at 218 and 220, and amorphous state phase change material at 222. The substantially amorphous state at 200a, referred to herein as one of the non-crystalline states, is the highest resistance state of phase change memory cell 106.

To program phase change material 204 into one of the other three states 200b-200d, a set current pulse is provided via write circuit 102 through first electrode 208 and phase change material 204. At 200b, write circuit 102 provides a set current pulse to program the small volume fraction 212 into a crystalline state. The crystalline state is less resistive than the amorphous state and phase change memory cell 106 at 200b has a lower resistance than phase change memory cell 106 in the substantially amorphous state at 200a. The partially crystalline and partially amorphous state at 200b, referred to herein as one of the non-crystalline states, is the second highest resistance state of phase change memory cell 106.

At 200c, write circuit 102 provides a set current pulse to program the medium volume fraction 214 into a crystalline state. Since the crystalline fraction 214 is larger than the crystalline fraction 212 and the crystalline state is less resistive than the amorphous state, phase change memory cell 106 at 200c has a lower resistance than phase change memory cell 106 at 200b and phase change memory cell 106 in the amorphous state at 200a. The partially crystalline and partially amorphous state at 200c, referred to herein as one of the non-crystalline states, is the second lowest resistance state of phase change memory cell 106.

At 200d, write circuit 102 provides a set current pulse to program substantially all of the phase change material 216 into the crystalline state. Since the crystalline state is less resistive than the amorphous state, phase change memory cell 106 at 200d has a lower resistance than phase change memory cell 106 at 200c, phase change memory cell 106 at 200b, and phase change memory cell 106 in the amorphous state at 200a. The substantially crystalline state at 200d is the lowest resistance state of phase change memory cell 106. In other embodiments, phase change memory cell 106 can be programmed into any suitable number of resistance values or states. In other embodiments, phase change memory cell 106 can be set to a substantially crystalline state and reset pulses can be used to program phase change memory cell 106 to the desired resistance value or state.

Figure 3:
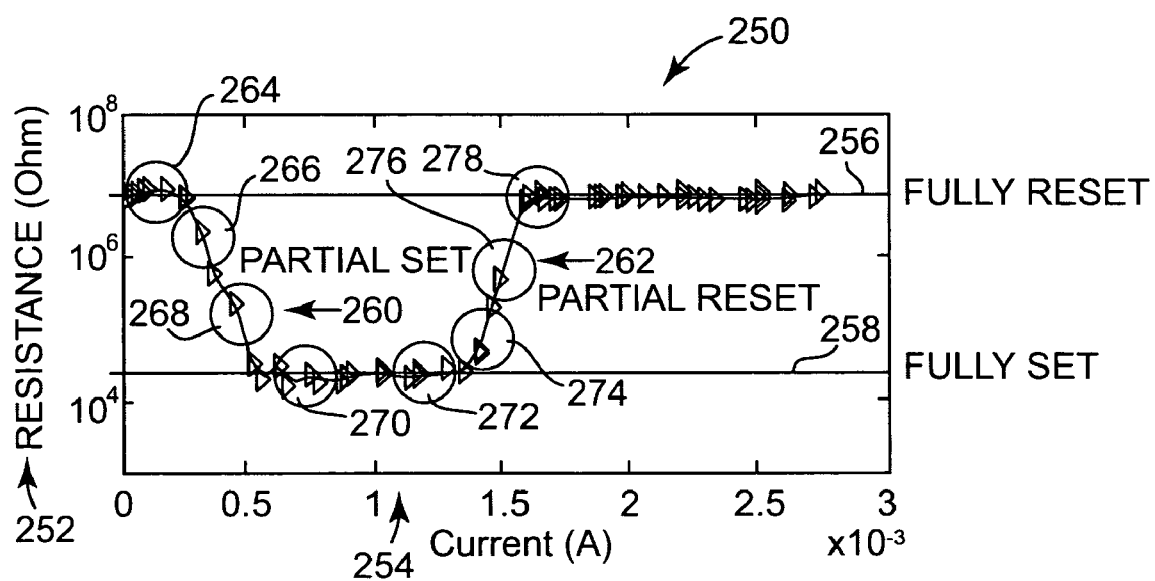
FIG. 3 is a graph illustrating one embodiment of setting the resistance states of a phase change memory cell.

FIG. 3 is a graph 250 illustrating one embodiment of setting the resistance states of a phase change memory cell 106. Graph 250 includes the current in Amps (A) applied to the phase change memory cell on x-axis 254 versus the resistance in Ohms of the phase change memory cell on y-axis 252 after applying the specified current. Starting from a fully reset phase change memory cell as indicated at 256, a current between approximately 0A and $0.3 \times 10^{-3}$ A does not change the resistance state of the phase change memory cell from the fully reset state. A current between approximately $0.3 \times 10^{-3}$ A and $0.5 \times 10^{-3}$ A changes the resistance state of the phase change memory cell to a partially set state as indicated at 260. A current between approximately $0.5 \times 10^{-3}$ A and $1.4 \times 10^{-3}$ A changes the resistance state of the phase change memory cell to a fully set state as indicated at 258. A current between approximately $1.4 \times 10^{-3}$ A and $1.6 \times 10^{-3}$ A changes the resistance state of the phase change memory cell to a partially reset state as indicated at 262. A current greater than approximately $1.6 \times 10^{-3}$ A changes the resistance state of the phase change memory cell back to the fully reset state as indicated at 256. The specific current ranges for obtaining the partially set, fully set, partially reset, and fully reset states vary based on the phase change material used, the memory cell concept used, and the memory cell dimensions used.

Starting from the fully reset state as indicated at 256, a phase change memory cell 106 can be programmed to one of four resistance states by controlling the current. If no current is applied, the phase change memory cell remains in the fully reset state. If a small current is applied, the phase change memory cell is programmed to a first state as indicated at 264. This state is illustrated at 200a in FIG. 2. In one embodiment, this state is a "11" state. If additional current is applied beyond the first state, the phase change memory cell is programmed to a second state as indicated at 266. This state is illustrated at 200b in FIG. 2. In one embodiment, this state is a "10" state. If additional current is applied beyond the second state, the phase change memory cell is programmed to a third state as indicated at 268. This state is illustrated at 200c in FIG. 2. In one embodiment, this state is a "01" state. If additional current is applied beyond the third state, the phase change memory cell is programmed to the fully set state as indicated at 270. This state is illustrated at 200d in FIG. 2. In one embodiment, this state is a "00" state.

Starting from the fully set state as indicated at 258, a phase change memory cell can also be programmed to one of four resistance states by controlling the current. For example, if a first current is applied, the phase change memory cell is programmed to a first state as indicated at 272. In one embodiment, this state is a "00" state. If additional current is applied beyond the first state, the phase change memory cell is programmed to a second state as indicated at 274. In one embodiment, this state is a "01" state. If additional current is applied beyond the second state, the phase change memory cell is programmed to a third state as indicated at 276. In one embodiment, this state is a "10" state. If additional current is applied beyond the third state, the phase change memory cell is programmed to the fully reset state as indicated at 278. In one embodiment, this state is a "11" state.

Figure 4:
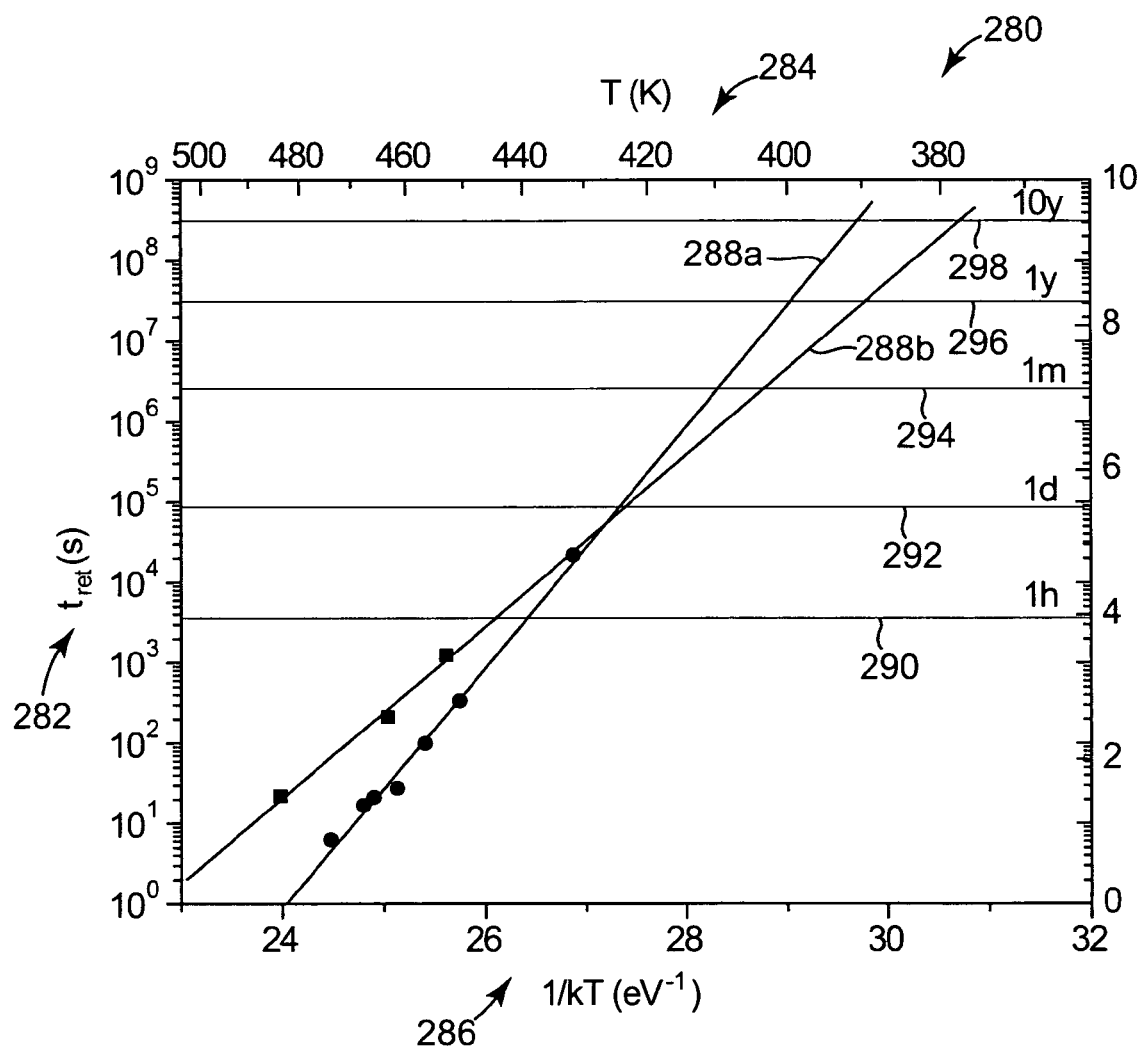
FIG. 4 is a chart illustrating one embodiment of retention time versus temperature for two different experiments.

FIG. 4 is a chart 280 illustrating one embodiment of retention time versus temperature for two different experiments. Chart 280 includes temperature (T) in Kelvin (K) on x-axis 284 and in 1/kT ($eV^{-1}$) on x-axis 286 and retention time ($t_{ret}$) in seconds (s) on Y-axis 282. Line 288a illustrates the retention time versus temperature for single bit memory cells in a first experiment, and line 288b illustrates the retention time versus temperature for single bit memory cells in a second experiment. The data retention time is critical for single bit phase change memory cells and the problem is enhanced for multi-bit phase change memory cells.

As illustrated in chart 280, the specification of 105° C. for 10 year data retention in memory device 100 is indicated at 298. Memory device 100 can be operated at a temperature of approximately 120° C. (393 K) if phase change memory cells 106 of memory device 100 are refreshed once a year as indicated at 296. Memory device 100 can be operated at a temperature of approximately 130° C. (403 K) if phase change memory cells 106 of memory device 100 are refreshed once a month as indicated at 294. Memory device 100 can be operated at a temperature of approximately 150° C. (423 K) if phase change memory cells 106 of memory device 100 are refreshed once a day as indicated at 292. Memory device 100 can be operated at a temperature of approximately 170° C. (443 K) if phase change memory cells 106 of memory device 100 are refreshed once an hour as indicated at 290. As the refresh period is shortened, the temperature memory device 100 can withstand increases.

Figure 5:
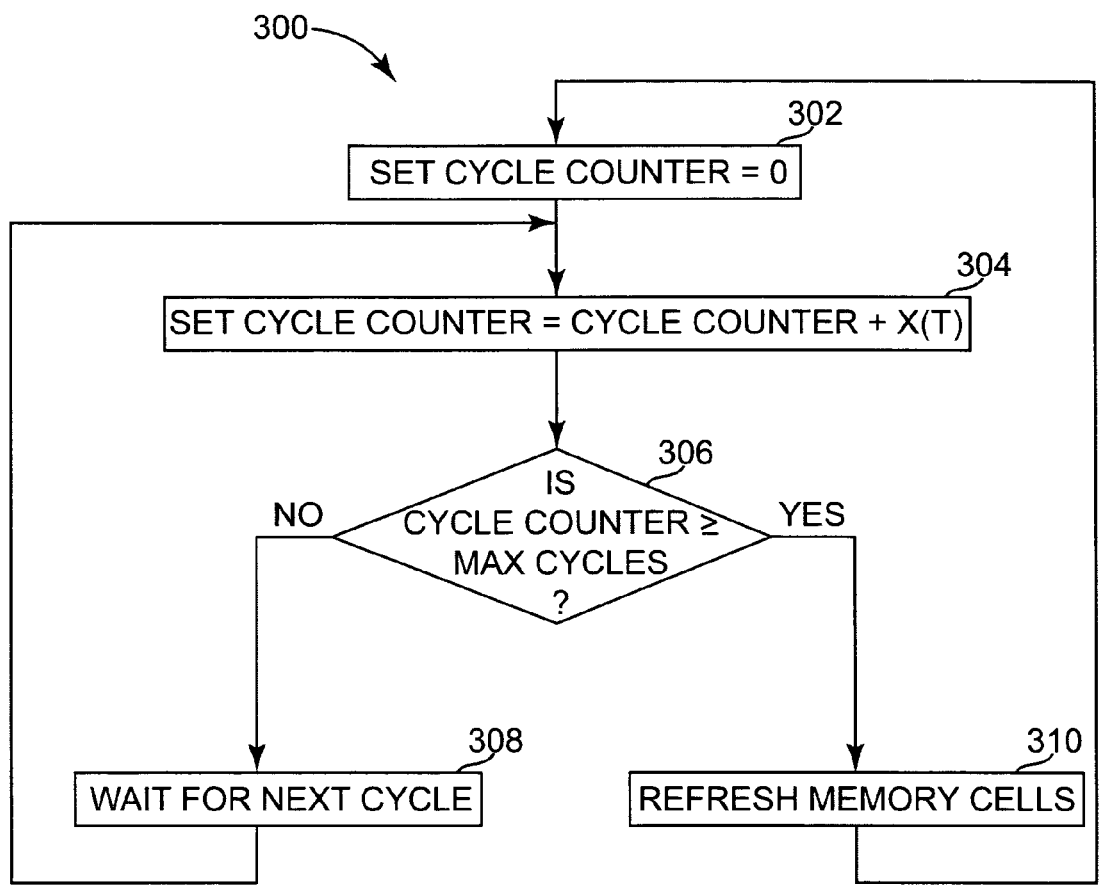
FIG. 5 is a flow diagram illustrating one embodiment of a method for refreshing phase change memory cells.

FIG. 5 is a flow diagram illustrating one embodiment of a method 300 for refreshing phase change memory cells 106a-106d. At 302, a clock cycle counter is reset to zero. At 304, the clock cycle counter is incremented by X(T) in response to each clock cycle of memory device 100. In one embodiment, X(T)=1 if temperature sensor 126 is not used. In another embodiment, if temperature sensor 126 is used, X(T) varies based on the temperature of memory device 100. In general, X(T) increases in response to an increase in temperature. In one embodiment, for temperatures below 60° C., X(T)=1, for temperatures between 60° C. and 90° C., X(T)=2, and for temperature above 90° C., X(T)=3. In other embodiments, other suitable values for X(T) can be used.

At 306, controller 118 determines whether the count of the clock cycle counter is greater than or equal to a maximum preset clock cycle count. The maximum preset clock cycle count is selected such that memory cells 106a-106d are refreshed before data stored within the memory cells is corrupted. In one embodiment, the maximum preset clock cycle count is $1\times10^4$, $1\times10^5$, $1\times10^6$, or other suitable clock cycle count.

If the count of the clock cycle counter is less than the maximum preset clock cycle count, then at 308 controller 118 waits for the next clock cycle and the clock cycle counter continues to increment at 304. If the count of the clock cycle counter is greater than or equal to the maximum preset clock cycle count, then at 310 controller 118 refreshes memory cells 106a-106d. After refreshing memory cells 106a-106d, the clock cycle counter is again reset at 302 and the process is repeated. In one embodiment, method 300 is applied to every memory cell 106 within memory device 100 simultaneously. In another embodiment, method 300 is applied to groups of memory cells 106 within memory device 100 individually, such as pages or blocks of memory cells.

Figure 6:
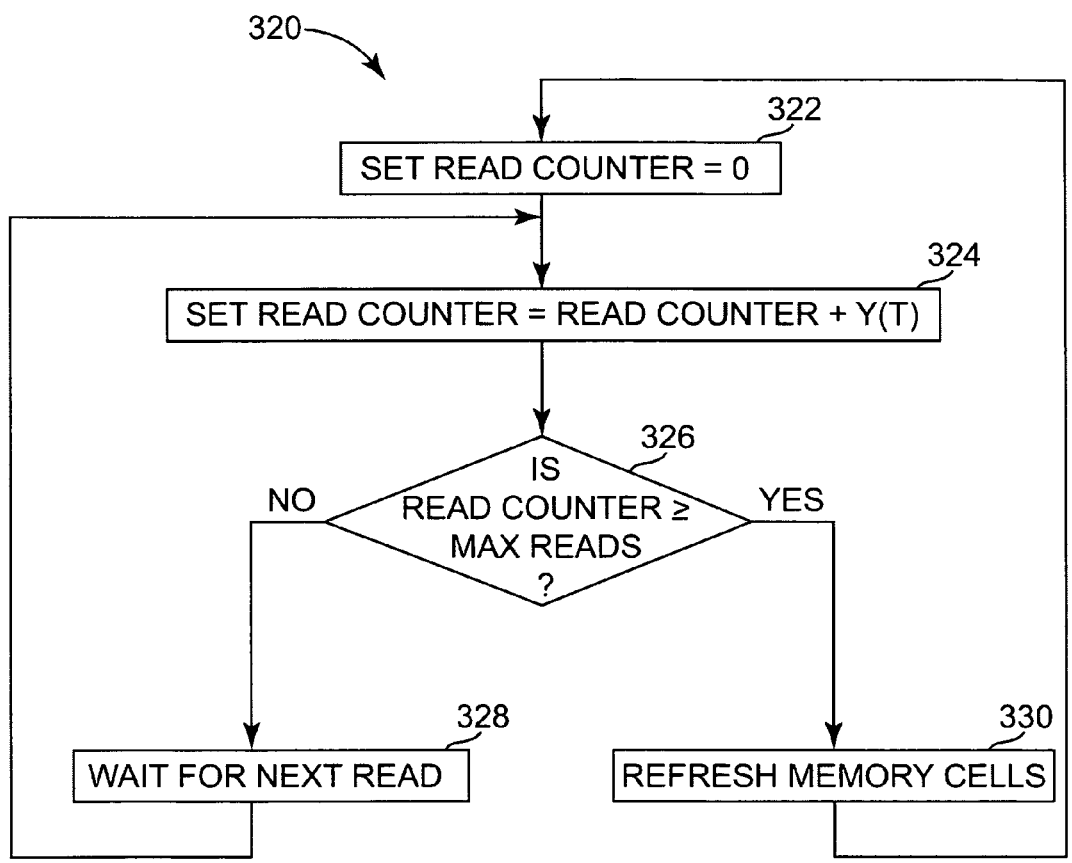
FIG. 6 is a flow diagram illustrating another embodiment of a method for refreshing phase change memory cells.

FIG. 6 is a flow diagram illustrating another embodiment of a method 320 for refreshing phase change memory cells 106a-106d. At 322, a read counter is reset to zero. At 324, the read counter is incremented by Y(T) in response to each read access of memory device 100. In one embodiment, Y(T)=1 if temperature sensor 126 is not used. In another embodiment, if temperature sensor 126 is used, Y(T) varies based on the temperature of memory device 100. In general, Y(T) increases in response to an increase in temperature. In one embodiment, for temperatures below 60° C., Y(T)=1, for temperatures between 60° C. and 90° C., Y(T)=2, and for temperature above 90° C., Y(T)=3. In other embodiments, other suitable values for Y(T) can be used.

At 326, controller 118 determines whether the count of the read counter is greater than or equal to a maximum preset read count. The maximum preset read count is selected such that memory cells 106a-106d are refreshed before data stored within the memory cells is corrupted. In one embodiment, the maximum preset read count is $1\times10^2$, $1\times10^3$, $1\times10^4$, or other suitable read count.

If the count of the read counter is less than the maximum preset read count, then at 328 controller 118 waits for the next read access and the read counter continues to increment at 324. If the count of the read counter is greater than or equal to the maximum preset read count, then at 330 controller 118 refreshes memory cells 106a-106d. After refreshing memory cells 106a-106d, the read counter is again reset at 322 and the process is repeated. In one embodiment, method 320 is applied to every memory cell 106 within memory device 100 simultaneously. In another embodiment, method 320 is applied to groups of memory cells 106 within memory device 100 individually, such as pages or blocks of memory cells.

Figure 7:
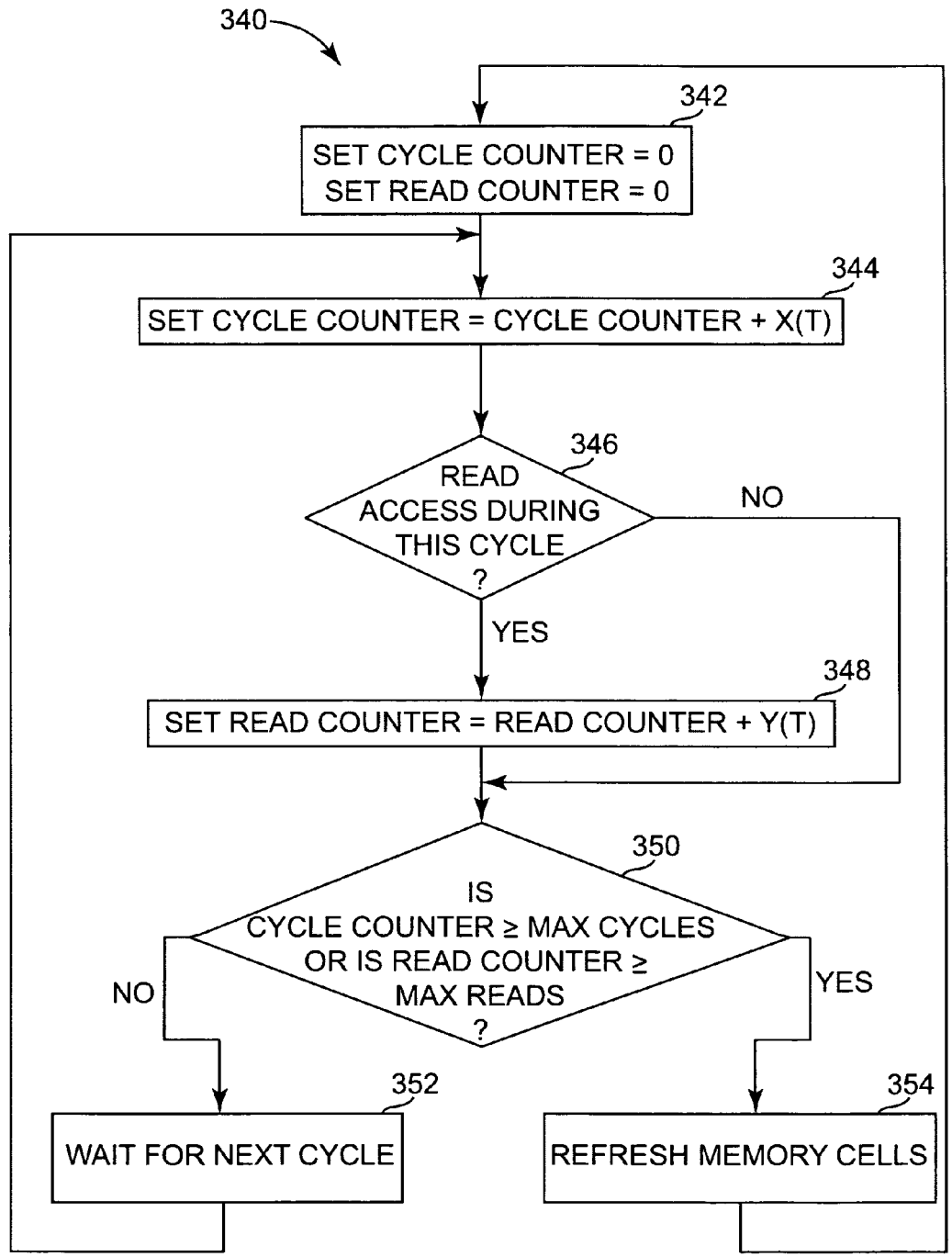
FIG. 7 is a flow diagram illustrating another embodiment of a method for refreshing phase change memory cells.

FIG. 7 is a flow diagram illustrating another embodiment of a method 340 for refreshing phase change memory cells 106a-106d. At 342, a clock cycle counter is reset to zero and a read counter is reset to zero. At 344, the clock cycle counter is incremented by X(T) in response to each clock cycle of memory device 100. In one embodiment, X(T)=1 if temperature sensor 126 is not used. In another embodiment, if temperature sensor 126 is used, X(T) varies based on the temperature of memory device 100. In general, X(T) increases in response to an increase in temperature. In one embodiment, for temperatures below 60° C., X(T)=1, for temperatures between 60° C. and 90° C., X(T)=2, and for temperature above 90° C., X(T)=3. In other embodiments, other suitable values for X(T) can be used.

At 346, controller 118 determines if there is a read access during the current clock cycle. If there is a read access during the current clock cycle, then at 348 the read counter is incremented by Y(T). In one embodiment, Y(T)=1 if temperature sensor 126 is not used. In another embodiment, if temperature sensor 126 is used, Y(T) varies based on the temperature of memory device 100. In general, Y(T) increases in response to an increase in temperature. In one embodiment, for temperatures below 60° C., Y(T)=1, for temperatures between 60° C. and 90° C., Y(T)=2, and for temperature above 90° C., Y(T)=3. In other embodiments, other suitable values for Y(T) can be used.

If there is no read access during the current clock cycle or after the read counter is incremented at 348, at 350 controller 118 determines whether the count of the clock cycle counter is greater than or equal to a maximum preset clock cycle count or whether the count of the read counter is greater than or equal to a maximum preset read cycle count. The maximum preset clock cycle count is selected such that memory cells 106a-106d are refreshed before data stored within the memory cells is corrupted. In one embodiment, the maximum preset clock cycle count is $1\times10^4$, $1\times10^5$, $1\times10^6$, or other suitable clock cycle count. The maximum preset read count is selected such that memory cells 106a-106d are refreshed before data stored within the memory cells is corrupted. In one embodiment, the maximum preset read count is $1\times10^2$, $1\times10^3$, $1\times10^4$, or other suitable read count.

If the count of the clock cycle counter is less than the maximum preset clock cycle count and if the count of the read counter is less than the maximum preset read count, then at 352 controller 118 waits for the next clock cycle and the clock cycle counter continues to increment at 344. If the count of the clock cycle counter is greater than or equal to the maximum preset clock cycle count or the count of the read counter is greater than or equal to the maximum preset read count, then at 354 controller 118 refreshes memory cells 106a-106d. After refreshing memory cells 106a-106d, the clock cycle counter and the read counter are again reset at 342 and the process is repeated. In one embodiment, method 340 is applied to every memory cell 106 within memory device 100 simultaneously. In another embodiment, method 340 is applied to groups of memory cells 106 within memory device 100 individually, such as pages or blocks of memory cells.

Figure 8:
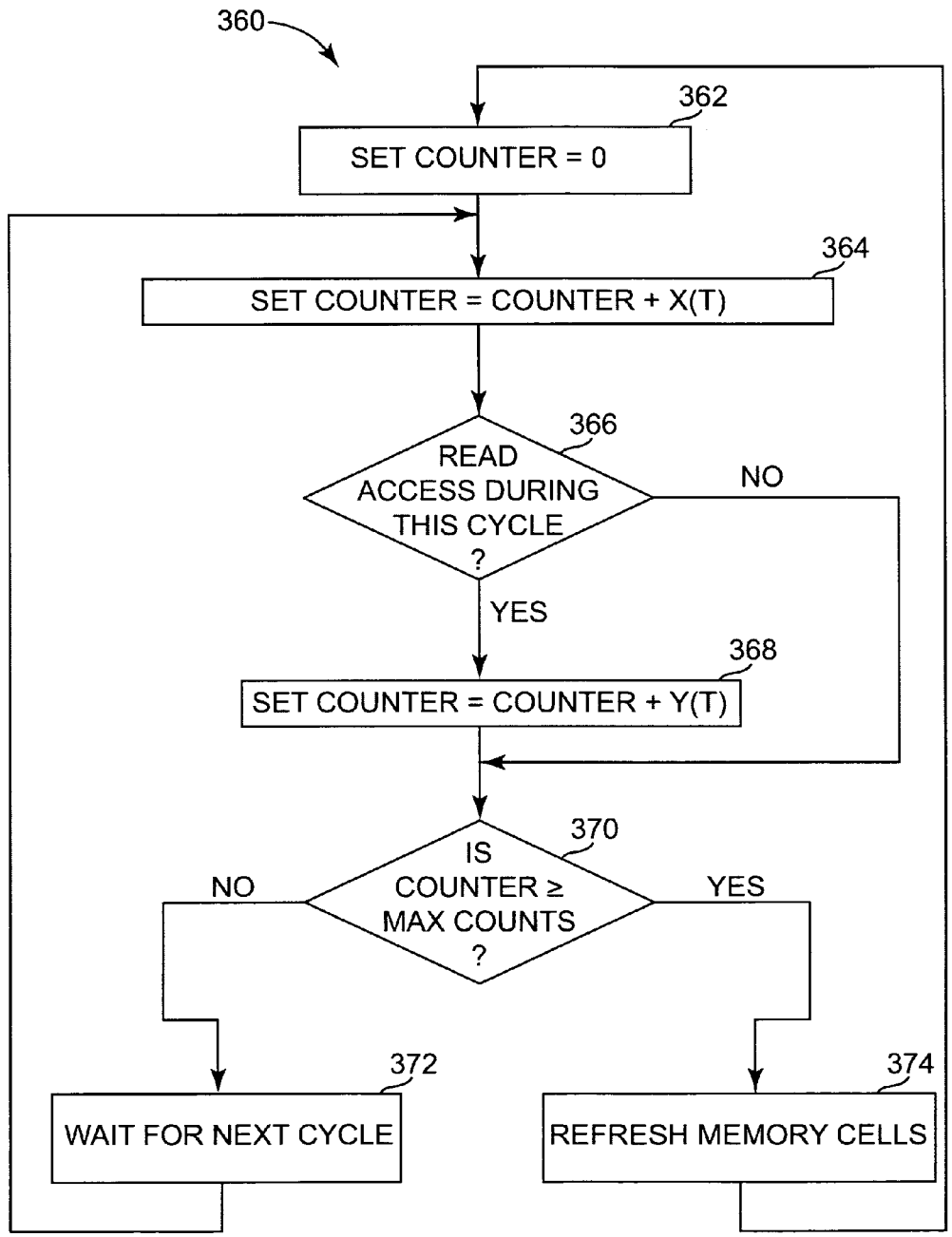
FIG. 8 is a flow diagram illustrating another embodiment of a method for refreshing phase change memory cells.

FIG. 8 is a flow diagram illustrating another embodiment of a method 360 for refreshing phase change memory cells 106a-106d. At 362, a counter is reset to zero. At 364, the counter is incremented by X(T) in response to each clock cycle of memory device 100. In one embodiment, X(T)=1 if temperature sensor 126 is not used. In another embodiment, if temperature sensor 126 is used, X(T) varies based on the temperature of memory device 100. In general, X(T) increases in response to an increase in temperature. In one embodiment, for temperatures below 60° C., X(T)=1, for temperatures between 60° C. and 90° C., X(T)=2, and for temperature above 90° C., X(T)=3. In other embodiments, other suitable values for X(T) can be used.

At 366, controller 118 determines if there is a read access during the current clock cycle. If there is a read access during the current clock cycle, then at 368 the counter is incremented by Y(T). In one embodiment, Y(T)=1 if temperature sensor 126 is not used. In another embodiment, if temperature sensor 126 is used, Y(T) varies based on the temperature of memory device 100. In general, Y(T) increases in response to an increase in temperature. In one embodiment, for temperatures below 60° C., Y(T)=1, for temperatures between 60° C. and 90° C., Y(T)=2, and for temperature above 90° C., Y(T)=3. In other embodiments, other suitable values for Y(T) can be used.

If there is no read access during the current clock cycle or after the counter is incremented at 368, at 370 controller 118 determines whether the count of the counter is greater than or equal to a maximum preset count. The maximum preset count is selected such that memory cells 106a-106d are refreshed before data stored within the memory cells is corrupted. In one embodiment, the maximum preset count is $1\times10^4$, $1\times10^5$, $1\times10^6$, or other suitable count.

If the count of the counter is less than the maximum preset count, then at 372 controller 118 waits for the next clock cycle and the counter continues to increment at 364. If the count of the counter is greater than or equal to the maximum preset count, then at 374 controller 118 refreshes memory cells 106a-106d. After refreshing memory cells 106a-106d, the counter is again reset at 362 and the process is repeated. In one embodiment, method 360 is applied to every memory cell 106 within memory device 100 simultaneously. In another embodiment, method 360 is applied to groups of memory cells 106 within memory device 100 individually, such as pages or blocks of memory cells.

Embodiments of the present invention provide methods for determining when to refresh phase change memory cells such that the data stored in the phase change memory cells is not corrupted. The embodiments may include clock cycle counters, read access counters, or combinations of clock cycle counters and read access counters. In addition, the increment steps of the counters can vary based on the current temperature of the memory device.

While the specific embodiments described herein substantially focused on using phase change memory elements, the present invention can be applied to any suitable type of resistive memory elements, such as conductive bridging random access memory (CBRAM) elements, transition metal oxide memory elements, or Perovskite memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    a plurality of resistive memory cells;
    a counter having a first increment step at a first temperature and a second increment step greater than the first increment step at a second temperature greater than the first temperature; and
    a circuit for refreshing the memory cells in response to the counter exceeding a preset value,
    wherein the counter increments in response to each read access of the memory cells.

2. The integrated circuit of claim 1, wherein the counter increments in response to each clock cycle of the integrated circuit.

3. The integrated circuit of claim 1, wherein the plurality of resistive memory cells comprises an array of multi-bit resistive memory cells.

4. The integrated circuit of claim 1, wherein the plurality of resistive memory cells comprises an array of phase change memory cells.

5. The integrated circuit of claim 1, wherein the circuit is located on a same chip as the plurality of resistive memory cells.

6. A memory device comprising:
    an array of resistive memory cells;
    a counter configured to increment in response to each clock cycle of the memory device and in response to each read access of the memory device; and
    a circuit for refreshing memory cells within the array in response to the counter exceeding a preset value,
    wherein a first increment step of the counter for each clock cycle varies in response to a temperature of the memory device and a second increment step of the counter for each read access varies in response to the temperature.

7. The memory device of claim 6, wherein the first increment step comprises a first step at a first temperature and a second step greater than the first step at a second temperature greater than the first temperature.

8. The memory device of claim 6, wherein the second increment step comprises a first step at a first temperature and a second step greater than the first step at a second temperature greater than the first temperature.

9. The memory device of claim 6, wherein the array of resistive memory cells comprises an array of multi-bit resistive memory cells.

10. The memory device of claim 6, wherein the array of resistive memory cells comprises an array of phase change memory cells.

11. A memory device comprising:
    an array of resistive memory cells;
    a first counter configured to increment in response to each read access of the memory device;
    a second counter configured to increment in response to each clock cycle of the memory device; and
    a circuit configured to refresh memory cells within the array in response to the first counter exceeding a first preset value or in response to the second counter exceeding a second preset value,
    wherein a first increment step of the first counter varies in response to a temperature of the memory device and a second increment step of the second counter varies in response to the temperature.

12. The memory device of claim 11, wherein the first increment step comprises a first step at a first temperature and a second step greater than the first step at a second temperature greater than the first temperature.

13. The memory device of claim 11, wherein the second increment step comprises a first step at a first temperature and a second step greater than the first step at a second temperature greater than the first temperature.

14. The memory device of claim 11, wherein the array of resistive memory cells comprises an array of multi-bit resistive memory cells.

15. The memory device of claim 11, wherein the array of resistive memory cells comprises an array of phase change memory cells.

16. A method for refreshing a memory, the method comprising:
    incrementing a counter in response to each read access of the memory; and refreshing resistive memory cells of the memory in response to the counter exceeding a preset value, wherein incrementing the counter comprises incrementing the counter by a first step at a first temperature and incrementing the counter by a second step greater than the first step at a second temperature greater than the first temperature.

17. The method of claim 16, wherein incrementing the counter comprises incrementing the counter in response to each clock cycle of the memory.

18. The method of claim 16, wherein refreshing the resistive memory cells comprises refreshing multi-bit resistive memory cells.

19. The method of claim 16, wherein refreshing the resistive memory cells comprises refreshing phase change memory cells.

20. A method for refreshing a memory, the method comprising:

incrementing a counter by a first increment step based on a temperature of the memory in response to each clock cycle of the memory;

incrementing the counter by a second increment step based on the temperature in response to each read access of the memory; and refreshing resistive memory cells of the memory in response to the counter exceeding a preset value.

21. The method of claim 20, wherein incrementing the counter in response to each clock cycle comprises incrementing the counter by a first step at a first temperature and incrementing the counter by a second step greater than the first step at a second temperature greater than the first temperature.

22. The method of claim 20, wherein incrementing the counter in response to each read access comprises incrementing the counter by a first step at a first temperature and incrementing the counter by a second step greater than the first step at a second temperature greater than the first temperature.

23. The method of claim 20, wherein refreshing the resistive memory cells comprises refreshing multi-bit resistive memory cells.

24. The method of claim 20, wherein refreshing the resistive memory cells comprises refreshing phase change memory cells.

25. A method for refreshing a memory, the method comprising:

incrementing a first counter in response to each read access of the memory;

incrementing a second counter in response to each clock cycle of the memory; and refreshing resistive memory cells of the memory in response to the first counter exceeding a first preset value or in response to the second counter exceeding a second preset value.

26. The method of claim 25, wherein incrementing the first counter comprises incrementing the first counter by a first increment step based on a temperature of the memory, and wherein incrementing the second counter comprises incrementing the second counter by a second increment step based on the temperature.

27. The method of claim 26, wherein incrementing the first counter by the first increment step comprises incrementing the first counter by a first step at a first temperature and by a second step greater than the first step at a second temperature greater than the first temperature.

28. The method of claim 26, wherein incrementing the second counter by the second increment step comprises incrementing the second counter by a first step at a first temperature and by a second step greater than the first step at a second temperature greater than the first temperature.

29. The method of claim 25, wherein refreshing the resistive memory cells comprises refreshing multi-bit resistive memory cells.

30. The method of claim 25, wherein refreshing the resistive memory cells comprises refreshing phase change memory cells.

* * * * *